(12) United States Patent
Floyd

(10) Patent No.: US 7,405,861 B2
(45) Date of Patent: Jul. 29, 2008

(54) METHOD AND DEVICE FOR PROTECTING INTERFEROMETRIC MODULATORS FROM ELECTROSTATIC DISCHARGE

(75) Inventor: Philip D. Floyd, Redwood City, CA (US)

(73) Assignee: IDC, LLC, San Francisco, CA (US)

( * ) Notice: Subject to any disclaimer, the term of this patent is extended or adjusted under 35 U.S.C. 154(b) by 325 days.

(21) Appl. No.: 11/119,651

(22) Filed: May 2, 2005

(65) Prior Publication Data

US 2006/0077504 A1 Apr. 13, 2006

Related U.S. Application Data

(60) Provisional application No. 60/613,492, filed on Sep. 27, 2004.

(51) Int. Cl.
*G02B 26/00* (2006.01)
*G02B 26/08* (2006.01)

(52) U.S. Cl. .................. 359/290; 359/196; 359/237

(58) Field of Classification Search ......... 359/224–225, 359/230–231, 245, 237–238, 240, 247, 267, 359/290–291, 298, 649
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |

(Continued)

FOREIGN PATENT DOCUMENTS

CH 681 047 12/1992

(Continued)

OTHER PUBLICATIONS

"A novel wideband, lithium niobate electrooptic modulator," Samuel Hopfer, et al., Journal of Lightwave Technology, vol. 16, No. 1, Jan. 1998, pp. 73-77.

(Continued)

*Primary Examiner*—Scott J. Sugarman
*Assistant Examiner*—Dawayne A Pinkney
(74) *Attorney, Agent, or Firm*—Knobbe, Martens, Olson & Bear, LLP

(57) ABSTRACT

A MEMS device such as an interferometric modulator includes an integrated ESD protection element capable of shunting to ground an excess current carried by an electrical conductor in the MEMS device. The protection element may be a diode and may be formed by depositing a plurality of doped semiconductor layers over the substrate on which the MEMS device is formed.

17 Claims, 12 Drawing Sheets

U.S. PATENT DOCUMENTS

| | | |
|---|---|---|
| 4,392,711 A | 7/1983 | Moraw et al. |
| 4,403,248 A | 9/1983 | Te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | Te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,214,724 A | 5/1993 | Seino et al. ............... 385/2 |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,359,449 A | 10/1994 | Nishimoto et al. .......... 359/181 |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,404,412 A | 4/1995 | Seino et al. ................... 385/2 |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,455,876 A | 10/1995 | Hopfer et al. .................. 385/2 |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |

| | | | | | | |
|---|---|---|---|---|---|---|
| 5,610,625 A | 3/1997 | Sampsell | | 6,201,633 B1 | 3/2001 | Peeters et al. |
| 5,619,059 A | 4/1997 | Li et al. | | 6,204,080 B1 | 3/2001 | Hwang |
| 5,619,365 A | 4/1997 | Rhoades et al. | | 6,219,015 B1 | 4/2001 | Bloom et al. |
| 5,619,366 A | 4/1997 | Rhoads et al. | | 6,232,936 B1 | 5/2001 | Gove et al. |
| 5,622,814 A | 4/1997 | Miyata et al. | | 6,243,149 B1 | 6/2001 | Swanson et al. |
| 5,629,790 A | 5/1997 | Neukermans et al. | | 6,246,398 B1 | 6/2001 | Koo |
| 5,633,652 A | 5/1997 | Kanbe et al. | | 6,249,039 B1 | 6/2001 | Harvey et al. |
| 5,636,052 A | 6/1997 | Arney et al. | | 6,282,010 B1 | 8/2001 | Sulzbach et al. |
| 5,636,185 A | 6/1997 | Brewer et al. | | 6,282,356 B1 | 8/2001 | Johnston, Jr. et al. ....... 385/129 |
| 5,638,084 A | 6/1997 | Kalt | | 6,284,560 B1 | 9/2001 | Jech et al. |
| 5,638,946 A | 6/1997 | Zavracky | | 6,295,154 B1 | 9/2001 | Laor et al. |
| 5,641,391 A | 6/1997 | Hunter et al. | | 6,310,700 B1 | 10/2001 | Betts ............................. 359/2 |
| 5,646,768 A | 7/1997 | Kaeiyama | | 6,323,982 B1 | 11/2001 | Hornbeck |
| 5,647,819 A | 7/1997 | Fujita et al. | | 6,327,071 B1 | 12/2001 | Kimura et al. |
| 5,650,834 A | 7/1997 | Nakagawa et al. | | 6,329,297 B1 | 12/2001 | Balish et al. |
| 5,650,881 A | 7/1997 | Hornbeck | | 6,335,224 B1 | 1/2002 | Peterson |
| 5,654,741 A | 8/1997 | Sampsell et al. | | 6,335,831 B2 | 1/2002 | Kowarz et al. |
| 5,657,099 A | 8/1997 | Doherty et al. | | 6,351,329 B1 | 2/2002 | Greywal |
| 5,659,374 A | 8/1997 | Gale, Jr. et al. | | 6,356,254 B1 | 3/2002 | Kimura |
| 5,665,997 A | 9/1997 | Weaver et al. | | 6,376,787 B1 | 4/2002 | Martin et al. |
| 5,673,139 A | 9/1997 | Johnson | | 6,391,675 B1 | 5/2002 | Ehmke et al. |
| 5,674,757 A | 10/1997 | Kim | | 6,392,233 B1 | 5/2002 | Channin et al. |
| 5,680,497 A | 10/1997 | Seino et al. ................. 385/129 | | 6,392,781 B1 | 5/2002 | Kim et al. |
| 5,683,591 A | 11/1997 | Offenberg | | 6,407,851 B1 | 6/2002 | Islam et al. |
| 5,703,710 A | 12/1997 | Brinkman et al. | | 6,447,126 B1 | 9/2002 | Hornbeck |
| 5,706,022 A | 1/1998 | Hato | | 6,452,465 B1 | 9/2002 | Brown et al. |
| 5,710,656 A | 1/1998 | Goosen | | 6,456,420 B1 | 9/2002 | Goodwin-Johansson |
| 5,726,480 A | 3/1998 | Pister | | 6,465,355 B1 | 10/2002 | Horsley |
| 5,739,945 A | 4/1998 | Tayebati | | 6,466,354 B1 | 10/2002 | Gudeman |
| 5,745,193 A | 4/1998 | Urbanus et al. | | 6,466,358 B2 | 10/2002 | Tew |
| 5,745,281 A | 4/1998 | Yi et al. | | 6,473,274 B1 | 10/2002 | Maimone et al. |
| 5,771,116 A | 6/1998 | Miller et al. | | 6,480,177 B2 | 11/2002 | Doherty et al. |
| 5,784,190 A | 7/1998 | Worley | | 6,496,122 B2 | 12/2002 | Sampsell |
| 5,784,212 A | 7/1998 | Hornbeck | | 6,513,911 B1 | 2/2003 | Ozaki et al. |
| 5,793,504 A | 8/1998 | Stoll | | 6,522,801 B1 | 2/2003 | Aksyuk et al. |
| 5,808,780 A | 9/1998 | McDonald | | 6,531,945 B1 | 3/2003 | Ahn et al. |
| 5,818,095 A | 10/1998 | Sampsell | | 6,537,427 B1 | 3/2003 | Raina et al. |
| 5,822,170 A | 10/1998 | Cabuz et al. | | 6,545,335 B1 | 4/2003 | Chua et al. |
| 5,824,608 A | 10/1998 | Gotoch et al. | | 6,548,908 B2 | 4/2003 | Chua et al. |
| 5,825,528 A | 10/1998 | Goosen | | 6,549,338 B1 | 4/2003 | Wolverton et al. |
| 5,835,255 A | 11/1998 | Miles | | 6,552,840 B2 | 4/2003 | Knipe |
| 5,838,484 A | 11/1998 | Goosen et al. | | 6,555,904 B1 | 4/2003 | Karpman |
| 5,842,088 A | 11/1998 | Thompson | | 6,574,033 B1 | 6/2003 | Chui et al. |
| 5,867,302 A | 2/1999 | Fleming et al. | | 6,577,785 B1 | 6/2003 | Spahn et al. |
| 5,895,742 A | 4/1999 | Lin ............................. 430/321 | | 6,589,625 B1 | 7/2003 | Kothari et al. |
| 5,912,758 A | 6/1999 | Knipe et al. | | 6,600,201 B2 | 7/2003 | Hartwell et al. |
| 5,943,158 A | 8/1999 | Ford et al. | | 6,606,175 B1 | 8/2003 | Sampsell et al. |
| 5,959,763 A | 9/1999 | Bozler et al. | | 6,608,268 B1 | 8/2003 | Goldsmith |
| 5,972,193 A | 10/1999 | Chou et al. | | 6,610,440 B1 | 8/2003 | LaFollette et al. |
| 5,976,902 A | 11/1999 | Shih | | 6,624,944 B1 | 9/2003 | Wallace et al. |
| 5,986,796 A | 11/1999 | Miles | | 6,625,047 B2 | 9/2003 | Coleman, Jr. |
| 6,016,693 A | 1/2000 | Viani et al. | | 6,630,786 B2 | 10/2003 | Cummings et al. |
| 6,028,690 A | 2/2000 | Carter et al. | | 6,632,698 B2 | 10/2003 | Ives |
| 6,038,056 A | 3/2000 | Florence et al. | | 6,635,919 B1 | 10/2003 | Melendez et al. |
| 6,040,937 A | 3/2000 | Miles | | 6,642,913 B1 | 11/2003 | Kimura et al. |
| 6,049,317 A | 4/2000 | Thompson et al. | | 6,643,069 B2 | 11/2003 | Dewald |
| 6,055,090 A | 4/2000 | Miles et al. | | 6,650,455 B1 | 11/2003 | Miles |
| 6,057,903 A | 5/2000 | Colgan et al. | | 6,657,832 B2 | 12/2003 | Williams et al. |
| 6,061,075 A | 5/2000 | Nelson et al. | | 6,666,561 B1 | 12/2003 | Blakley |
| 6,099,132 A | 8/2000 | Kaeiyama | | 6,671,149 B1 * | 12/2003 | Chea et al. ..................... 361/87 |
| 6,100,872 A | 8/2000 | Aratani et al. | | 6,674,562 B1 | 1/2004 | Miles et al. |
| 6,113,239 A | 9/2000 | Sampsell et al. | | 6,674,563 B2 | 1/2004 | Chui et al. |
| 6,115,326 A | 9/2000 | Puma et al. | | 6,680,792 B2 | 1/2004 | Miles |
| 6,136,630 A | 10/2000 | Weigold | | 6,687,896 B1 | 2/2004 | Royce et al. |
| 6,147,790 A | 11/2000 | Meier et al. | | 6,710,908 B2 | 3/2004 | Miles et al. |
| 6,158,156 A | 12/2000 | Patrick | | 6,720,267 B1 | 4/2004 | Chen et al. |
| 6,160,833 A | 12/2000 | Floyd et al. | | 6,734,054 B2 * | 5/2004 | Tang et al. ................... 438/197 |
| 6,166,422 A | 12/2000 | Qian et al. | | 6,736,987 B1 | 5/2004 | Cho |
| 6,180,428 B1 | 1/2001 | Peeters et al. | | 6,741,377 B2 | 5/2004 | Miles |
| 6,194,323 B1 | 2/2001 | Downey et al. | | 6,741,384 B1 | 5/2004 | Martin et al. |
| 6,195,191 B1 | 2/2001 | Osenbach et al. ........... 359/238 | | 6,741,503 B1 | 5/2004 | Farris et al. |
| 6,195,196 B1 | 2/2001 | Kimura et al. | | 6,743,570 B2 | 6/2004 | Harnett et al. |
| 6,198,855 B1 | 3/2001 | Hallemeier et al. ............ 385/2 | | 6,747,785 B2 | 6/2004 | Chen et al. |

| Patent Number | Date | Inventor(s) |
|---|---|---|
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,794,119 B2 | 9/2004 | Miles |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,912,022 B2 | 6/2005 | Lin et al. |
| 6,952,303 B2 | 10/2005 | Lin et al. |
| 6,952,304 B2 | 10/2005 | Mushika et al. |
| 6,958,847 B2 | 10/2005 | Lin |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,049,164 B2 | 5/2006 | Bruner |
| 7,064,880 B2 | 6/2006 | Mushika |
| 7,110,158 B2 | 9/2006 | Miles |
| 7,123,216 B1 | 10/2006 | Miles |
| 7,145,213 B1 | 12/2006 | Ebel |
| 7,172,915 B2 | 2/2007 | Lin et al. |
| 2001/0003487 A1 | 6/2001 | Miles |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0015215 A1* | 2/2002 | Miles ............... 359/290 |
| 2002/0021485 A1 | 2/2002 | Pilossof |
| 2002/0024711 A1 | 2/2002 | Miles |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0126364 A1 | 9/2002 | Miles |
| 2002/0135857 A1 | 9/2002 | Fitzpatrick et al. |
| 2002/0137072 A1 | 9/2002 | Mirkin et al. |
| 2002/0145185 A1 | 10/2002 | Shrauger |
| 2002/0149828 A1 | 10/2002 | Miles et al. |
| 2002/0168136 A1 | 11/2002 | Atia et al. |
| 2003/0006468 A1 | 1/2003 | Ma et al. |
| 2003/0008420 A1 | 1/2003 | Chang et al. |
| 2003/0043157 A1 | 3/2003 | Miles |
| 2003/0053730 A1 | 3/2003 | Seino ............... 385/2 |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0123123 A1* | 7/2003 | Huffman ............... 359/248 |
| 2003/0132822 A1 | 7/2003 | Ko et al. |
| 2003/0138213 A1 | 7/2003 | Jiin et al. |
| 2003/0152872 A1 | 8/2003 | Miles |
| 2003/0179527 A1* | 9/2003 | Chea, Jr. ............... 361/91.1 |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0231373 A1 | 12/2003 | Kowarz et al. |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0040828 A1 | 3/2004 | Ivanciw et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Tayebati |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0150936 A1* | 8/2004 | Chea, Jr. ............... 361/119 |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park et al. |
| 2004/0191937 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0146404 A1* | 7/2005 | Yeatman ............... 335/78 |
| 2005/0168849 A1 | 8/2005 | Lin |

| | | | |
|---|---|---|---|
| 2005/0195462 A1 | 9/2005 | Lin | |
| 2005/0195467 A1 | 9/2005 | Kothari et al. | |
| 2005/0202649 A1 | 9/2005 | Hung et al. | |
| 2005/0248340 A1* | 11/2005 | Berkcan et al. | 324/259 |
| 2006/0056001 A1 | 3/2006 | Taguchi et al. | |
| 2006/0066932 A1 | 3/2006 | Chui et al. | |
| 2006/0066935 A1 | 3/2006 | Cummings et al. | |

FOREIGN PATENT DOCUMENTS

| | | |
|---|---|---|
| CN | 092109265 | 11/2003 |
| DE | 10228946 A1 | 1/2004 |
| EP | 0173808 | 3/1986 |
| EP | 0 667 548 A1 | 8/1995 |
| EP | 0694801 A | 1/1996 |
| EP | 0695959 A | 2/1996 |
| EP | 0878824 A2 | 11/1998 |
| EP | 1197778 A | 4/2002 |
| EP | 1258860 A1 | 11/2002 |
| EP | 1 452 481 A | 9/2004 |
| JP | 02-068513 | 3/1990 |
| JP | 1789177 | 9/1993 |
| JP | 405275401 A | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002 062493 | 2/2002 |
| JP | 2002-062505 | 2/2002 |
| JP | 2002-270575 | 9/2002 |
| JP | 2002-355800 | 12/2002 |
| JP | 2003001598 A | 1/2003 |
| JP | 2004-102022 A | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO2006/036542 | 4/2002 |
| WO | WO03007049 A1 | 1/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2005/019899 A1 | 3/2005 |
| WO | WO 2005/085932 A | 9/2005 |
| WO | WO 2006/036385 | 4/2006 |
| WO | WO 2006/036437 | 4/2006 |

OTHER PUBLICATIONS

Akasaka, "Three-Dimensional IC Trends," Proceedings of IEEE; vol. 74, No. 12, pp. 1703-1714, (Dec. 1986).
Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).

Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573, date unknown.
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process; A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. 1996.
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (0125/2006).
PCT/US05/031693 International Search Report.
PCT/US05/032231 International Search Report (Apr. 7, 2006).
PCT/US05/033558 Partial International Search Report (Feb. 24, 2006).
PCT/US2004/035820 International Search Report and Written Opinion (Apr. 11, 2005).

PCT/US96/17731 Search Report.

Raley et al., "A Fabry-Perot Microinterferometer for Visible Wavelengths," IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Aratani et al., "Process and Design Considerations for a Surface Micromachined Beams for a Tuneable Interferometer Array in Silicon," Proc. IEEE Microelectromechanical Workshop, Fort Lauderdale, FL, pp. 230-235 (Feb. 1993).

Austrian Search Report for EX72/2005 dated May 13, 2005.

Austrian Search Report for EX81/2005 dated May 18, 2005.

Austrian Search Report for EX170/2005 dated Jul. 6, 2005.

Austrian Search Report for EX139/2005 dated Jul. 27, 2005.

Bains, "Digital Paper Display Technology Holds Promise For Portables," CommsDesign EE Times (2000).

Bass, Handbook of Optics, vol. 1, Fundamentals, Techniques, and Design, Second Edition, McGraw-Hill, inc. New York pp. 2.29/2.36 (1995).

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminium" Nature vo 337 Jan. 12, 1989, pp. 147-149.

Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http://www.pentavacuum.com/memes.htm.

Science and Technology, The Economist, pp. 89-90, (May 1999).

Search Report PCT/US05/031237 (Dec. 29, 2005).

Search Report PCT/US05/030033 and Written Opinion.

Search Report PCT/US05/030902.

Search Report and Written Opinion for PCT/US05/33558 (May 19, 2005).

Search Report PCT/US05/032331 (Apr. 7, 2006).

Search Report PCT/US05/032331 (Jan. 9, 2006).

Search Report and written opinion PCT/US05/032647.

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Thin Film Transistors- Materials and Processes-vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product information.

Extended Search Report for European App No. 05255640.4, dated Nov. 16, 2007.

* cited by examiner

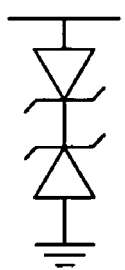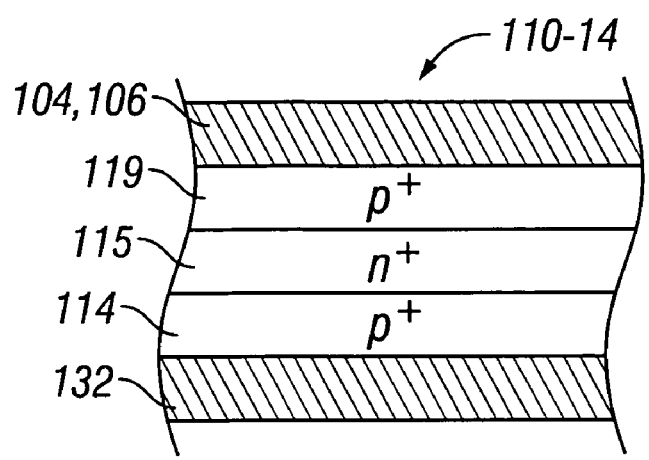
FIG. 14A  FIG. 14B
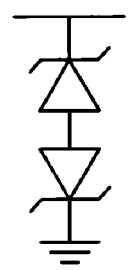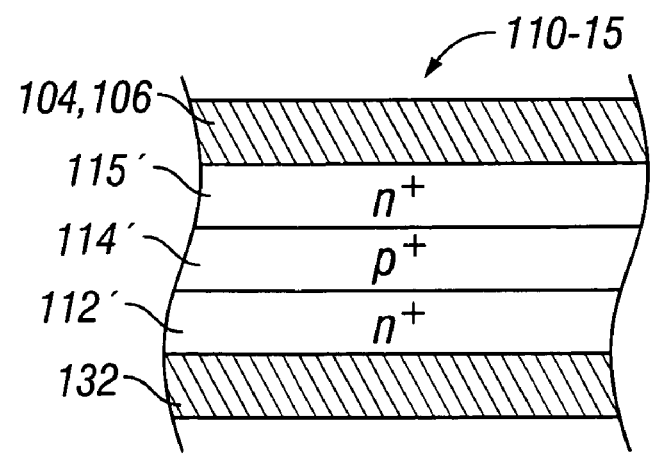
FIG. 15A  FIG. 15B

METHOD AND DEVICE FOR PROTECTING INTERFEROMETRIC MODULATORS FROM ELECTROSTATIC DISCHARGE

CROSS-REFERENCE TO RELATED APPLICATION

This application claims priority to U.S. Patent Application Ser. No. 60/613,492, filed Sep. 27, 2004 which is hereby incorporated by reference in its entirety.

BACKGROUND

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by a gap. Such devices have a wide range of applications, and it would be beneficial in the art to utilize and/or modify the characteristics of these types of devices so that their features can be exploited in improving existing products and creating new products that have not yet been developed.

SUMMARY

The systems, methods, and devices described herein each have several aspects, no single one of which is solely responsible for its desirable attributes. Without limiting the scope of this invention, its more prominent features will now be discussed briefly. After considering this discussion, and particularly after reading the section entitled "Detailed Description of the Preferred Embodiments" one will understand how the various embodiments described herein provide advantages over other methods and display devices.

An embodiment provides a MEMS device that includes a moveable element, an electrical conductor configured to carry an actuation current that is effective to actuate the moveable element, and a protection element operably attached to the electrical conductor. The protection element is configured to at least partially shunt to ground an excess current carried by the electrical conductor. The moveable element, electrical conductor and protection element are integrated over a substrate.

Another embodiment provides an interferometric modulator that includes an electrode integrated with a substrate and configured to carry an actuation current, and a protection element connected to the electrode and configured to at least partially shunt to ground an excess current carried by the electrode. The protection element is integrated with the substrate.

Another embodiment provides a display device that includes a substrate, a plurality of interferometric modulators formed over the substrate, and a plurality of protection elements integrated with the plurality of interferometric modulators over the substrate. The plurality of protection elements are electrically connected to at least partially protect the plurality of interferometric modulators from an electrostatic discharge.

Another embodiment provides a method of making an interferometric modulator device that includes depositing a first electrode layer over a substrate, depositing a sacrificial layer over the first electrode layer, and depositing a second electrode layer over the sacrificial layer. The method also includes depositing a plurality of doped semiconductor layers over the substrate and forming a ground plane over the substrate. The ground plane and the plurality of doped semiconductor layers are configured to shunt to ground an excess current carried by at least one of the first electrode layer and the second electrode layer.

These and other embodiments are described in greater detail below.

BRIEF DESCRIPTION OF THE DRAWINGS

These and other aspects of this invention will now be described with reference to the drawings of preferred embodiments (not to scale) which are intended to illustrate and not to limit the invention.

FIG. 14A is a symmetrical Zener diode circuit diagram and FIG. 14B is a side section view of an embodiment of a corresponding symmetrical Zener diode ESD protection element.

FIG. 15A is a back-to-back Zener diode circuit diagram and FIG. 15B is a side section view of an embodiment of a corresponding back-to-back Zener diode ESD protection element.

DETAILED DESCRIPTION OF THE PREFERRED EMBODIMENTS

A preferred embodiment is an interferometric modulator with an integrated electrostatic discharge (ESD) protection element. The protection element may be a diode such as a back-to-back Zener diode, standard Zener diode, low capacitance Zener diode, symmetrical Zener diode, and low capacitance symmetrical diode. The integrated protection element may be formed by depositing appropriately configured doped semiconductor layers onto the interferometric modulator substrate.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
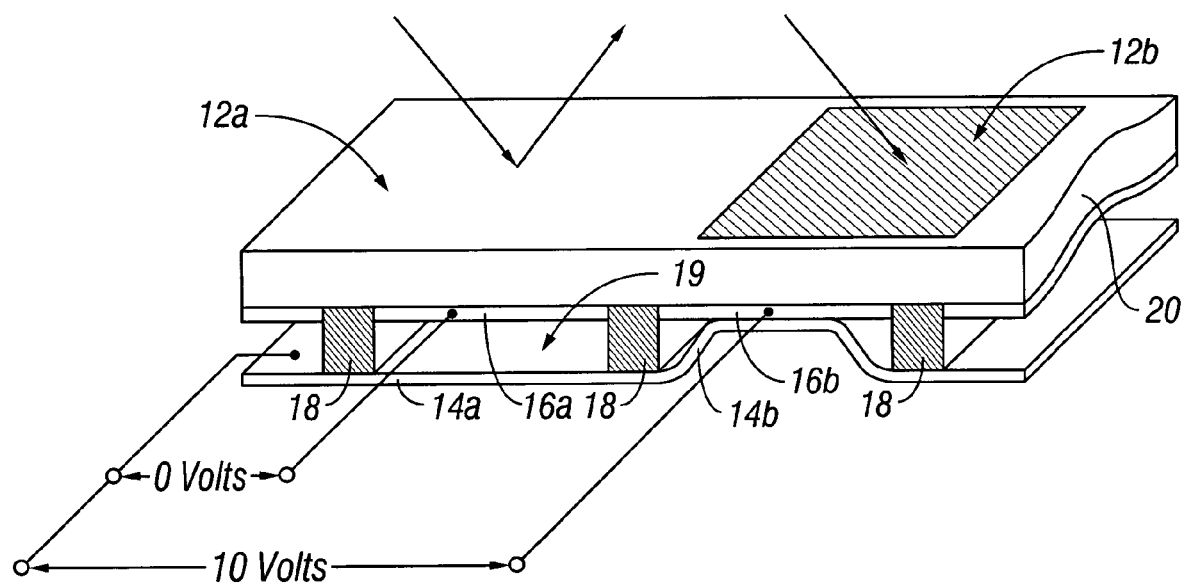
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a relaxed position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
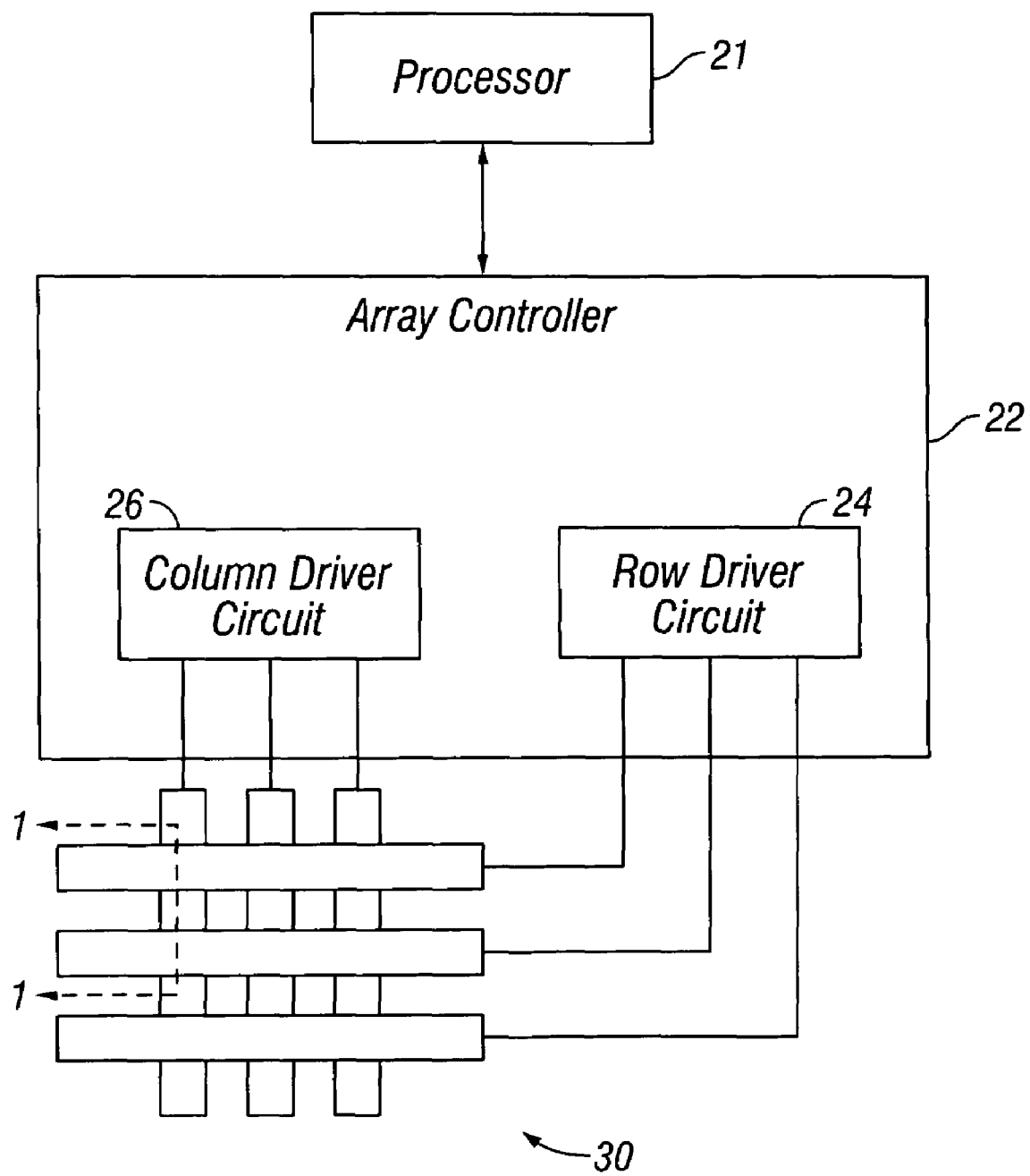
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
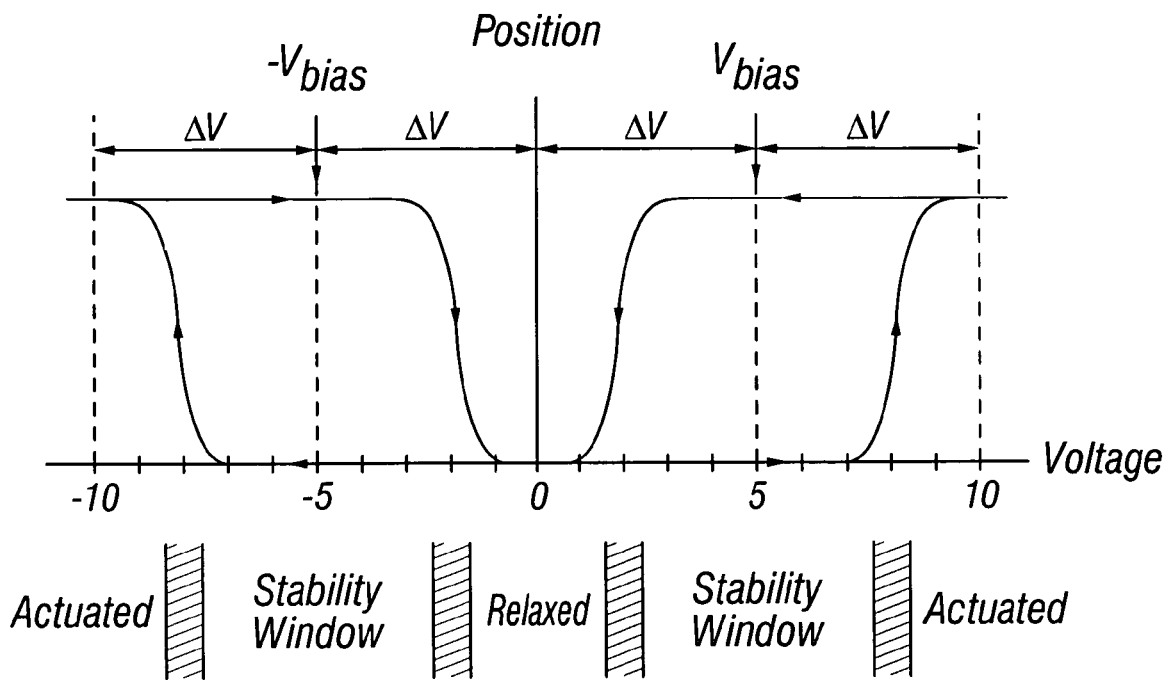
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
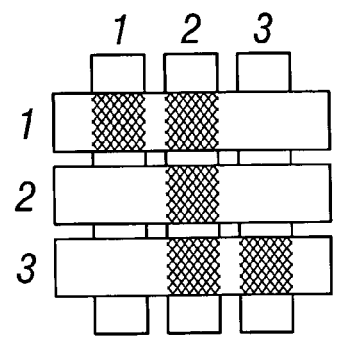
FIGS. 5A and 5B illustrate one exemplary timing diagram for row and column signals that may be used to write a frame of display data to the 3×3 interferometric modulator display of FIG. 2.
Figure 5B:
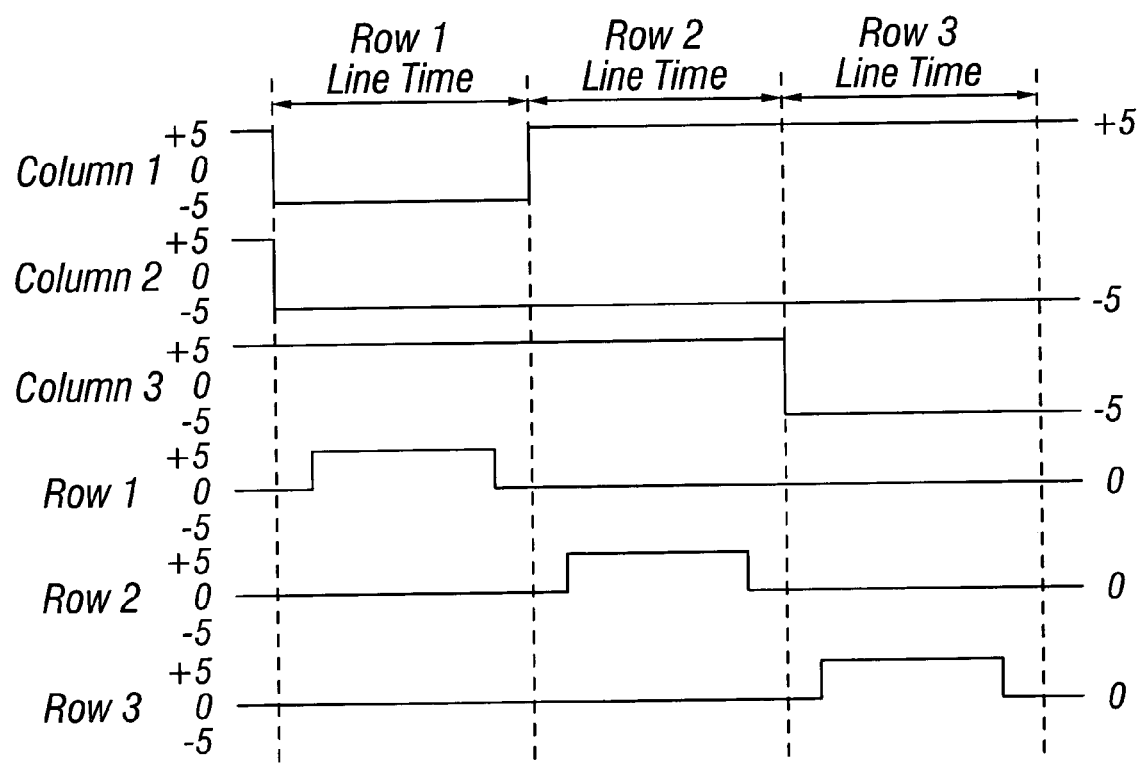

FIG. 5B is a timing diagram showing a series of row and column signals applied to the 3'33 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
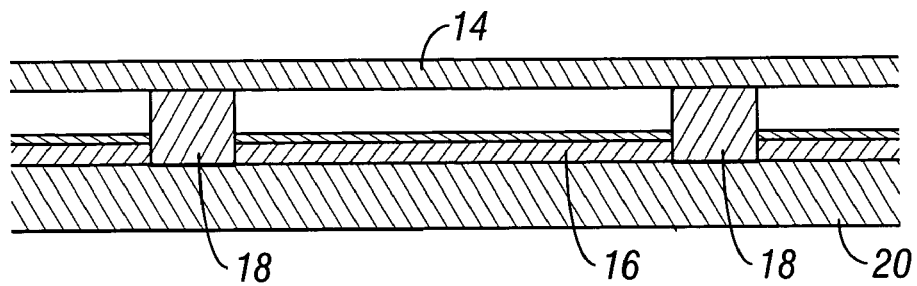
FIG. 6A is a cross section of the device of FIG. 1.
Figure 6B:
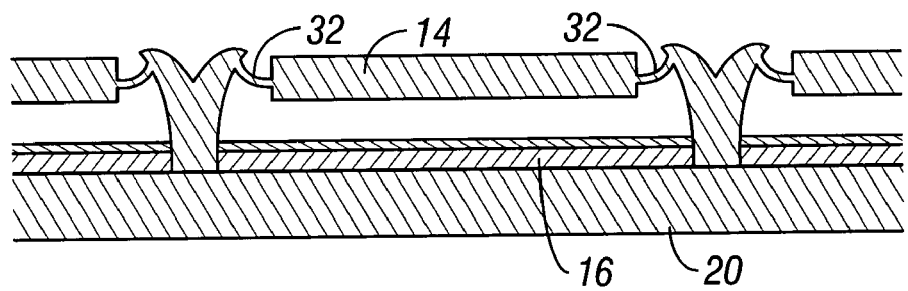
FIG. 6B is a cross section of an alternative embodiment of an interferometric modulator.
Figure 6C:
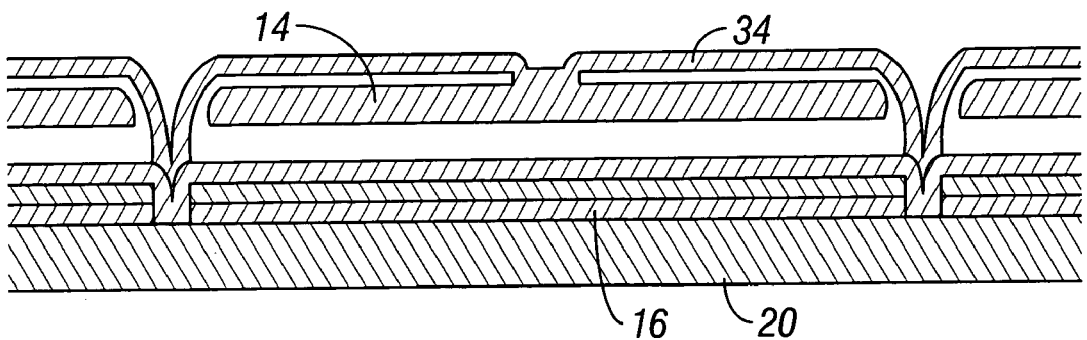
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of known techniques may be used to produce the above described structures involving a series of material deposition, patterning, and etching steps.

MEMS devices (such as interferometric modulators) are vulnerable to damage from electrostatic discharge (ESD) events. ESD is the transfer of charge between two materials at different electrical potentials. Materials can become electrostatically charged in various ways. For example, electrostatic charge may be created by the contact and separation of two similar or dissimilar materials, e.g., a person walking across the floor generates an electrostatic charge as shoe soles contact and then separate from the floor surface. An electrostatic charge may also be created on a material in other ways such as by induction, ion bombardment, or contact with another charged object. The electrostatic potential on an electrostatically charged material may be many thousands of volts.

A MEMS device may become electrostatically charged, e.g., during manufacture, packaging, testing or use, as the device and/or metal leads make contact(s) and separation(s) with various surfaces. The transfer of electrostatic charge to or from a MEMS device is an example of an ESD event. The electrical current that flows as a result of an ESD event may damage a MEMS device because of the relatively small size of the MEMS device component(s) and the relatively high voltages that may be involved. For example, an electrical conductor in a MEMS device may be designed to operate at voltages in the range of about 0.1 to about 25 volts. An electrostatic potential of thousands of volts resulting from an ESD event may result in excess current flows that cause, e.g., metal melt, junction breakdown, and/or oxide failure, leading to device damage and/or failure. As used herein, the term "excess current" refers to an amount of electrical current in an electrical conductor of a MEMS device that is in excess of the amount that the conductor was designed to carry or an amount that causes or has the potential to cause damage to a MEMS device containing or attached to the electrical conductor. The term "MEMS device" includes MEMS devices that are in the process of being manufactured, packaged, tested and/or attached to other devices, and thus includes "unreleased" MEMS devices (i.e., with a sacrificial material occupying the cavity in which motion is later accommodated) and partially released MEMS devices, as well as MEMS devices that have been incorporated into other products or devices. For example, the term "interferometric modulator" includes both functioning interferometric modulators and unreleased interferometric modulators.

An embodiment provides a MEMS device that is at least partially protected from an excess current (caused by, e.g., an ESD event) by a protection element. The MEMS device may include a moveable element and an electrical conductor configured to carry an actuation current that is effective to actuate the moveable element. The MEMS device may also include a protection element operably attached to the electrical conductor and configured to at least partially shunt to ground an excess current carried by the electrical conductor. The moveable element, electrical conductor and protection element are preferably integrated over a substrate. Various aspects of a MEMS device embodiment are illustrated below in the context of an interferometric modulator. However, it will be understood that these aspects are applicable to other interferometric modulator configurations (such as those illustrated in FIG. 6) and other MEMS devices as well.

Figure 7:
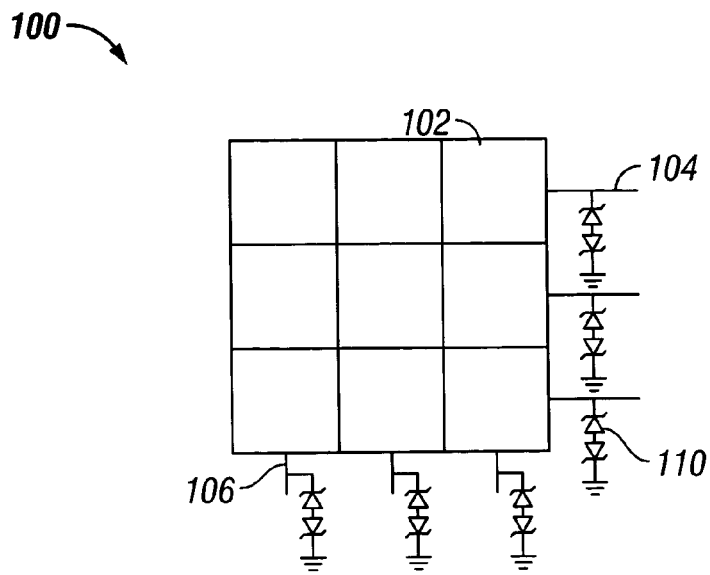
FIG. 7 is a schematic plan view of an array of interferometric modulator devices, corresponding row and column leads, and exemplary electrostatic protection elements.

FIG. 7 is a schematic plan illustration of an interferometric modulator array 100 comprising a plurality of interferometric modulator devices 102 which in this embodiment are arranged in a substantially rectangular array. The plurality of interferometric modulator devices 102 are interconnected by corresponding row lines 104 and column lines 106. The row and column lines 104, 106 are electrical conductors that extend generally across the array 100 in an overlapping orientation such that each interferometric modulator device 102 of the array 100 can be addressed by addressing the corresponding intersecting row and column lines 104, 106.

The interferometric modulator array 100 and the individual interferometric modulator devices 102 thereof may be subject to damage or malfunction upon undesired exposure to an excess current such as that caused by an ESD event. Accordingly, the interferometric modulator array 100 is provided with a plurality of protection elements 110 that, in this embodiment, are provided to each of the row and column lines 104, 106 in a one-to-one correspondence. In other embodiments however, a plurality of row and/or column lines 104, 106 may be connected in parallel to a single protection element 110 and in yet other embodiments, a single row or column line 104, 106 may be connected to multiple protection elements 110. Thus, the one-to-one correspondence between row or column lines 104, 106 and protection elements 110 shown in FIG. 7 is simply one particular embodiment.

The protection elements 110 are interconnected between corresponding row and column lines 104, 106 in such a manner that an excess current appearing on a row or column line 104, 106 is shunted via a corresponding protection element 110 to ground to reduce the likelihood of damage or malfunction to the corresponding interferometric modulator device(s) 102. FIG. 7 illustrates the protection elements 110 with the circuit character for a back-to-back Zener diode arrangement. However it will be appreciated that this is simply one particular embodiment of a protection element 110 and that other circuit elements, including diodes (e.g., operating under an avalanche breakdown mechanism), fuses, actively switched limiter circuits, or the like can be employed as the protection elements 110 in other embodiments. The protection elements 110 may be symmetrical protection elements including, e.g., the protection elements illustrated in FIGS. 14-16 and discussed below.

Figure 8:
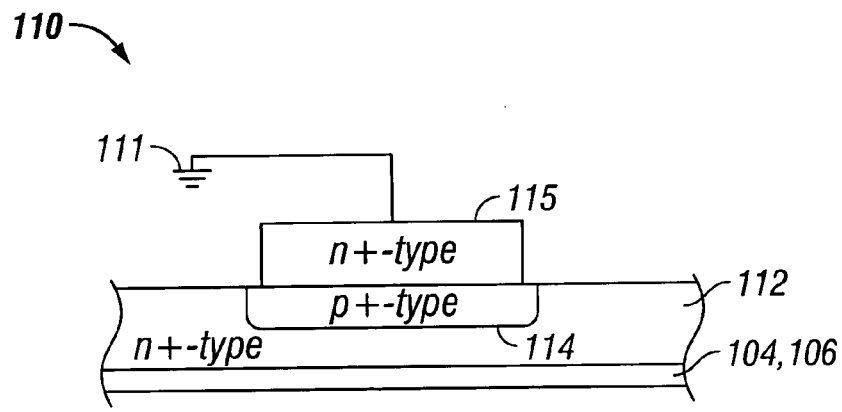
FIG. 8 is a side section view of one embodiment of a protection element.

FIG. 8 illustrates in side section view one embodiment of a protection element 110 in greater detail. In this embodiment, an electrical conductor corresponding generically to either a row line 104 or column line 106 is connected to a layer of heavily doped n+-type semiconductor 112. A well structure of heavily doped p+-type semiconductor 114 is implanted, deposited, or otherwise formed in a variety of known matters. A layer of heavily doped n+-type semiconductor 115 is formed and is further connected to a circuit ground 111. The layer of heavily doped n+-type semiconductor 115 may comprise the same material as used in the layer of heavily doped n+-type semiconductor 112 or a different material. The n+-type semiconductor 112, p+-type semiconductor 114, and n+-type semiconductor 115 together define an n-p-n junction forming a circuit corresponding to the back-to-back Zener diode 110 embodiment illustrated in FIG. 7. The semiconductor layers 112, 144, 115 preferably comprise amorphous silicon deposited by plasma-enhanced chemical vapor deposition ("PECVD").

Figure 9:
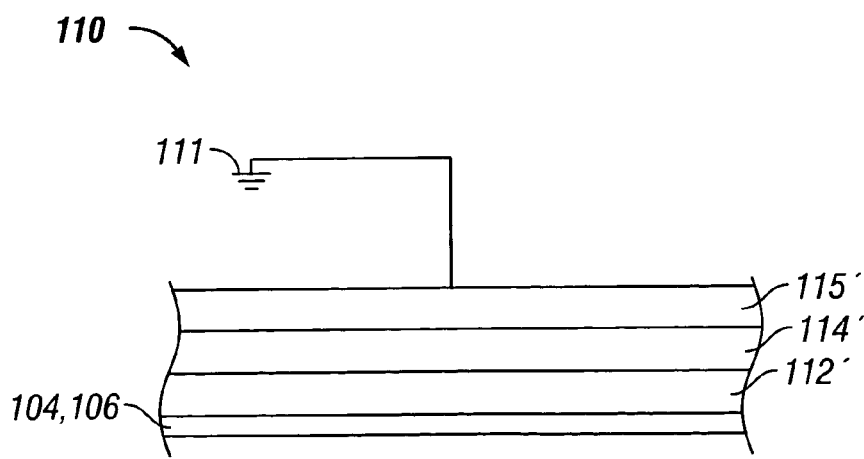
FIG. 9 is a side section view of an alternative embodiment of a protection element.

FIG. 9 illustrates an alternative embodiment of a protection element 110' which is similar in operation to the protection element 110 as illustrated in FIG. 8, but with the difference that rather than the p+-type semiconductor being formed as a well structure within the layer of n+-type semiconductor 112 as shown in FIG. 8, in the embodiment of protection element 110' of FIG. 9, the p+-type semiconductor 114' is formed as an overlying layer on the n+-type semiconductor layer 112'. A layer of heavily doped n+-type semiconductor 115' is formed on the layer 114' and connected to circuit ground 111.

Thus, in an embodiment, undesirable excess currents on the row or column lines 104, 106 will induce a reverse bias to the n-p-n junctions of the protection elements 110 and if of sufficient magnitude will induce a reverse breakdown of a p-n junction. The magnitude at which reverse breakdown occurs may be selected by controlling the amount of dopant in the semiconductors 112, 114, 115 and the thicknesses of the layers. Typically, the p+ and n+ dopant concentrations in the amorphous silicon semiconductor layers 112, 114, 115 are about $10^{18}$ cm$^{-3}$ or higher (dopant atoms per cubic centimeter) and each of the layers 112, 114, 115 has a thickness in the range of about 500 Å to about 5000 Å. Reverse breakdown is typically by a Zener mechanism, avalanche mechanism and/or a combination thereof. The protection elements 110 allow a relatively large reverse breakdown current to be conducted through the protection elements 110 in a manner that in many situations is nondestructive to the protection elements 110. Thus, in these embodiments, depending on the magnitude of the undesirable excess current experienced by the interferometric modulator array 100, the protection elements 110 can provide protection for multiple ESD events.

Figure 10:
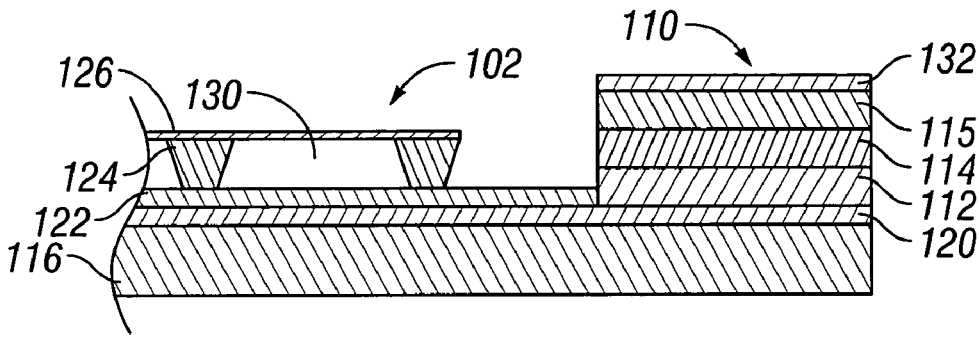
FIG. 10 is a side section view of one embodiment of a single interferometric modulator device of an array of interferometric modulator devices with an integrated protection element.

FIG. 10 illustrates in side section view one particular embodiment of an individual interferometric modulator device 102 of an interferometric modulator array 100 that is provided with an integrated or built-in protection element 110. In this embodiment, the interferometric modulator device 102 comprises a substrate 116 that is substantially optically transparent as well as provides structural support for the interferometric modulator array 100. An optical layer 120 is formed over the substrate 116. In this embodiment, the optical layer 120 comprises a layer of indium tin oxide (ITO) and a layer of chromium. The optical layer 120 functions in a manner similar to the reflective layer 16 in FIG. 1 as discussed above. The optical layer 120 is an electrical conductor and is at least partially optically transparent, and may be referred to herein as an electrode.

A dielectric layer 122 is formed over the optical layer 120. During operation, the dielectric layer 122 prevents electrical shorts between the optical layer 120 and a moveable mechanical/mirror layer 126. The mechanical/mirror layer 126 is supported over the substrate 116 by a plurality of vertically extending posts 124. The mechanical/mirror layer 126 is an electrical conductor and is optically reflective, and may be referred to herein as an electrode. The mechanical/mirror layer 126 functions in a manner similar to the moveable reflective layer 14 illustrated in FIG. 1 and discussed above. The mechanical/mirror layer 126 together with the supporting posts 124 defines a gap 130 in the interstitial space between the mechanical/mirror layer 126 and the dielectric layer 122. During operation, the optical layer 120 and the mechanical/mirror layer 126 both carry an actuation current that is effective to actuate the mechanical/mirror layer 126 in the general manner described above with reference to FIG. 1.

FIG. 10 also shows that the interferometric modulator array 100 further comprises an integrated protection element 110 arranged over the substrate 116. Protection element 110 comprises the n+-type semiconductor layer 112 deposited on the optical layer 120, the p+-type semiconductor layer 114 deposited on the n+-type semiconductor layer 112, and the n+-type semiconductor 115 deposited on the p+-type semiconductor layer 114. The layers 112, 114, 115 thus form a back-to-back Zener diode of the general type illustrated in FIG. 9. Protection element 110 is arranged near or at an outer edge or periphery of the interferometric modulator array 100 and over the substrate 116. Protection element 110 is attached to a ground plane 132 that is formed on the n+-type semiconductor 115 and connected to a circuit ground (not shown). The ground plane 132 is an electrical conductor and comprises a metal (aluminum in the illustrated embodiment). Protection element 110 is connected to the optical layer 120 (an electrical conductor) and configured such that undesirable excess currents (e.g., ESD events) appearing on the optical layer 120 bias the n-p-n junctions defined by the n+-type semiconductor 115, the p+-type semiconductor 114, and the n+-type semiconductor 112, causing a reverse breakdown of this n-p-n arrangement and at least partially shunting to ground the excess current carried by the optical layer 120. This invention is not limited by theory of operation, and thus other mechanisms for shunting to ground the excess current may be operational, in place of or in addition to reverse breakdown of the n-p-n arrangement.

Figure 11:
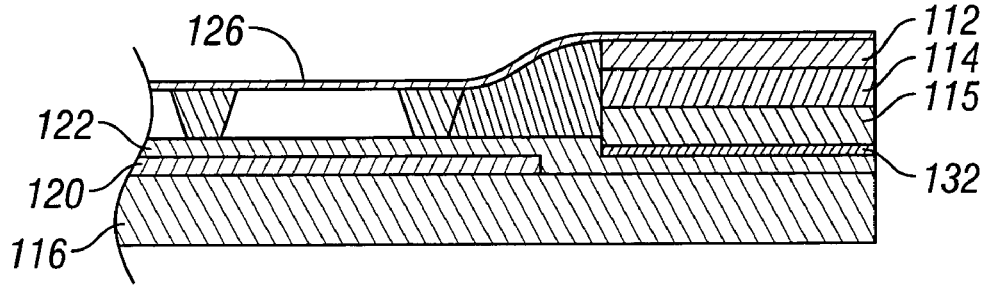
FIG. 11 is a side section view of a complementary embodiment of a single interferometric modulator device of an array of interferometric modulator devices with an integrated protection element.

FIG. 11 is a side section view of a further embodiment in which an interferometric modulator array 100 comprises an interferometric modulator 102 and an integrated protection element 110 arranged over the substrate 116. The embodiment of protection element 110 illustrated in FIG. 11 is substantially similar in operation to the embodiment of protection element 110 illustrated and described with respect to FIG. 10 but with the difference that the protection element 110 of FIG. 11 is complementary in construction and configured for connection to the mechanical/mirror layer 126 of the interferometric modulator 102. It will be appreciated that either of the mechanical/mirror layer 126 or the optical layer 120 can be formed as the row or column lines 104, 106 depending upon the particular configuration of the array 100 as well as the conventions for designating the corresponding electrical conductors as row or column lines 104, 106.

In the embodiment illustrated in FIG. 11, the protection element 110 is connected to the mechanical/mirror layer 126 of the interferometric modulator 102. The protection element 110 illustrated in FIG. 11 is substantially similar to the protection element 110 illustrated in FIG. 10 except that that the n+-type semiconductor 112, the p+-type semiconductor 114, the n+-type semiconductor 115, and the ground plane 132 are inverted with respect to the arrangement illustrated in FIG. 10. Thus, in a manner analogous to that previously described, an excess current appearing on the mechanical/mirror layer 126 reverse biases the n-p-n junction defined by the n+-type semiconductor 115, the p+-type semiconductor 114, and n+-type semiconductor 112, shunting at least a portion of the excess current to the ground plane 132. The protection element 110 thus provides protection to the interferometric modulator device 102 against undesirable excess currents such as those resulting from one or more ESD events.

As illustrated in FIG. 7 and discussed above, the protective elements and the interferometric modulators may be arranged in various configurations to form a display device comprising a plurality of interferometric modulators and a plurality of protection elements. For example, any particular interferometric may have two electrodes, the first of which is attached to a first protection element and the second of which is attached to a second protection element. Preferably, the plurality of interferometric modulators and the plurality of protection elements are integrated over a substrate. The term "integration" as used herein refers to components that are formed by semiconductor fabrication techniques (e.g., deposition and patterning) over the same substrate. Integration over a substrate may be accomplished in various ways. For example, in the embodiments illustrated in FIGS. 10 and 11, the interferometric modulator 102 (including the moveable electrode 126 and the electrode 120) and the protection element 110 are integrated at substantially the same level over the substrate 116. It will be appreciated that FIGS. 1-17 are not necessarily to scale, and thus, for example, the relative sizes and distances between various structures may be different from what is indicated in the illustrated embodiments.

FIGS. 7-8 illustrate the protection elements 110 with the circuit character for a back-to-back Zener diode arrangement and FIGS. 10-11 illustrate the integration of such a protection element 110 with the substrate 116. However, other protection elements may be used in addition to or in place of the protection elements 110, in configurations such as those illustrated in FIGS. 10-11 or in other configurations. For example, FIGS. 12-16 illustrate a variety of diode circuit diagrams and corresponding diode layer configurations suitable for use as integrated protection elements in MEMS devices. In each of FIGS. 12-16, the various n, p, n+ and p+ layers may be deposited by PECVD techniques known to those skilled in the art, with layer thicknesses and doping levels selected by routine experimentation so that the resulting protection element undergoes reverse breakdown at an excess current level that provides the desired degree of protection. Typically, the n, p, n+ and p+ layers comprise amorphous silicon, with dopant concentrations for the p+ and n+ layers of $10^{18}$ cm$^{-3}$ or higher (dopant atoms per cubic centimeter) and dopant concentrations for the p and n layers of less than $10^{18}$ cm$^{-3}$ (dopant atoms per cubic centimeter). The thicknesses of each of the n, p, n+ and p+ layers illustrated in FIGS. 12-16 is typically in the range of about 500 Å to about 5000 Å, but may be higher or lower in particular situations. In each of FIGS. 12-16, it is to be understood that the various n, p, n+ and p+ layers may be deposited in reverse order, depending on the configuration of the interferometric modulator and the electrical conductor to which the protection element is operably connected. For example, as discussed above, the protection element 110 of FIG. 11 is complementary in construction to the protection element 110 of FIG. 10.

Figure 12A:
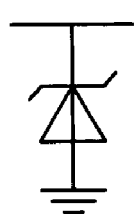
FIG. 12A is a standard Zener diode circuit diagram and FIG. 12B is a side section view of an embodiment of a corresponding standard Zener diode ESD protection element.
Figure 12B:
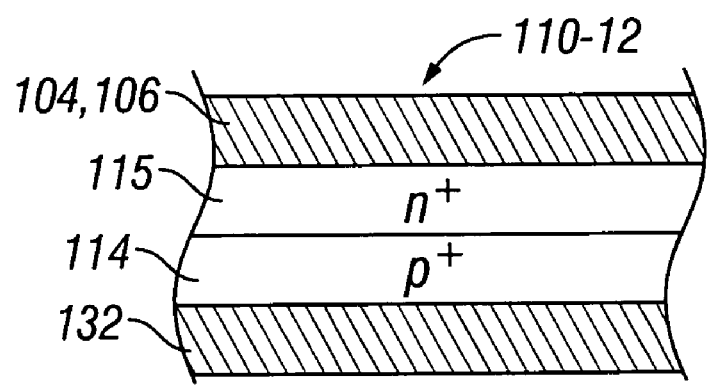

FIG. 12 shows a standard Zener diode circuit diagram (FIG. 12A) and a side section view of a corresponding integrated standard Zener diode protection element 110-12 (FIG. 12B). FIG. 12B shows a layer of the heavily doped p+-type semiconductor 114 deposited onto a ground plane 132 (connected to a circuit ground, not shown), and a layer of the heavily doped n+-type semiconductor 115 deposited onto the layer 114. An electrical conductor (corresponding generically to either a row line 104 or column line 106) is formed on the n+-type semiconductor 115.

Figure 13A:
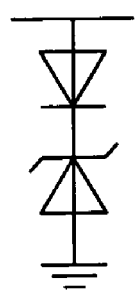
FIG. 13A is a low capacitance Zener diode circuit diagram and FIG. 13B is a side section view of an embodiment of a corresponding low capacitance Zener diode ESD protection element.
Figure 13B:
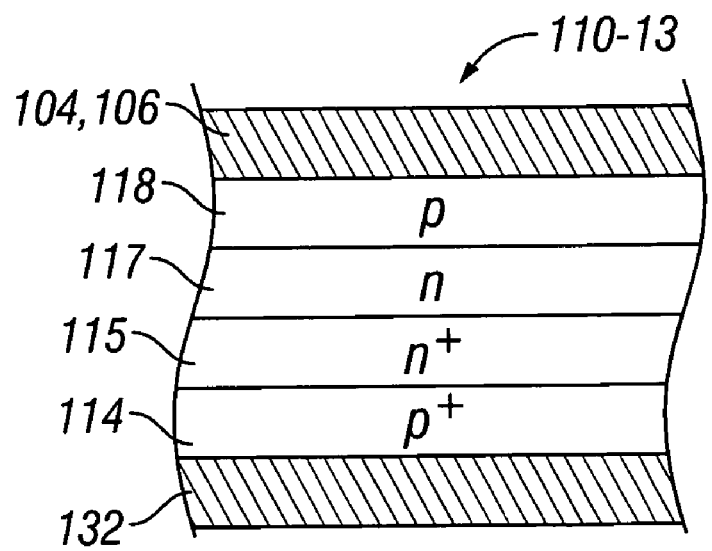

FIG. 13 shows a low capacitance Zener diode circuit diagram (FIG. 13A) and a side section view of a corresponding integrated low capacitance Zener diode protection element 110-13 (FIG. 13B). FIG. 13B shows a layer of the heavily doped p+-type semiconductor 114 deposited onto a ground plane 132 (connected to a circuit ground, not shown), and a layer of the heavily doped n+-type semiconductor 115 deposited onto the layer 114. A layer of n-type semiconductor 117 is deposited onto the layer 115, and a layer of p-type semiconductor 118 is deposited onto the layer 117. An electrical conductor (corresponding generically to either a row line 104 or column line 106) is formed on the p-type semiconductor 118.

FIG. 14 shows a symmetrical Zener diode circuit diagram (FIG. 14A) and a side section view of a corresponding integrated symmetrical Zener diode protection element 110-14 (FIG. 14B). FIG. 14B shows a layer of the heavily doped p+-type semiconductor 114 deposited onto a ground plane 132 (connected to a circuit ground, not shown), and a layer of the heavily doped n+-type semiconductor 115 deposited onto the layer 114. A layer of heavily doped p+-type semiconductor 119 is deposited onto the layer 115. The heavily doped p+-type semiconductor 119 may comprise the same material as used in the heavily doped p+-type semiconductor 114 or a different material. An electrical conductor (corresponding generically to either a row line 104 or column line 106) is formed on the heavily doped p+-type semiconductor 119.

FIG. 15 shows a back-to-back Zener diode circuit diagram (FIG. 15A) and a side section view of a corresponding integrated back-to-back Zener diode protection element 110-15 (FIG. 15B). A similar back-to-back Zener diode protection element 110' is illustrated in FIG. 9. FIG. 15B shows a layer of the heavily doped n+-type semiconductor 112' deposited onto a ground plane 132 (connected to a circuit ground, not shown), and a layer of the heavily doped p+-type semiconductor 114' deposited onto the layer 112'. A layer of the heavily doped n+-type semiconductor 115' is deposited onto the layer 114'. The heavily doped n+-type semiconductor 112' may comprise the same material as used in the heavily doped p+-type semiconductor 115' or a different material. An electrical conductor (corresponding generically to either a row line 104 or column line 106) is formed on the heavily doped n+-type semiconductor 115'.

Figure 16A:
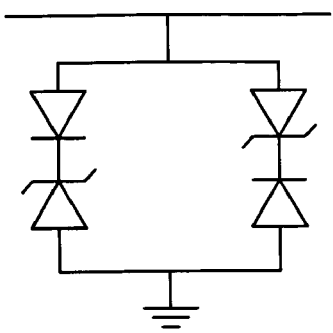
FIG. 16A is a low capacitance symmetrical diode circuit diagram and FIG. 16B is a side section view of an embodiment of a corresponding low capacitance symmetrical diode ESD protection element.
Figure 16B:
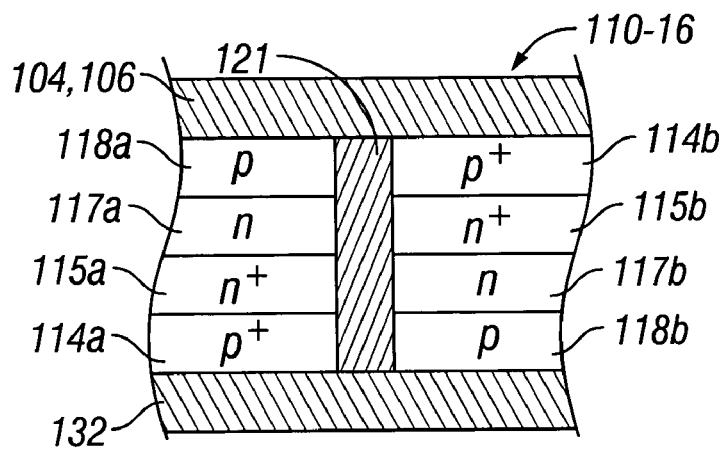

FIG. 16 shows a low capacitance symmetrical diode circuit diagram (FIG. 16A) and a side section view of a corresponding integrated low capacitance symmetrical diode protection element 110-16 (FIG. 16B). FIG. 16B shows that the left side of protection element 110-16 is similar to the low capacitance Zener diode protection element 110-13 illustrated in FIG. 13, comprising a layer of heavily doped p+-type semiconductor 114a deposited onto a ground plane 132 (connected to a circuit ground, not shown), a layer of heavily doped n+-type semiconductor 115a deposited onto the layer 114a, a layer of n-type semiconductor 117a deposited onto the layer 115a, and a layer of p-type semiconductor 118a deposited onto the layer 117a. As further illustrated in FIG. 16B, the right side of protection element 110-16 is separated from the left side by an insulator 121, and comprises the same layers as the left side but in reverse order. Thus, the right side of protection element 110-16 comprises a layer of p-type semiconductor 118b deposited onto the ground plane 132, a layer of n-type semiconductor 117b deposited onto the layer of p-type semiconductor 118b, a layer of heavily doped n+-type semiconductor 115b deposited onto the layer 117b, and a layer of heavily doped p+-type semiconductor 114b deposited onto the layer 115b. An electrical conductor (corresponding generically to either a row line 104 or column line 106) is formed on the p-type semiconductor 118a, the insulator 121 and the heavily doped p+-type semiconductor 114b.

The interferometric modulator array 100 including integrated protection elements 110 as described offers the advantage of a relatively simple structure that may provide effective ESD protection in a manner that does not significantly increase the overall extent or footprint of the array 100. Further, the protection elements 110 may be readily fabricated with materials which are already utilized in formation of embodiments of the interferometric modulator devices 102. For example, the ground plane 132 may be readily and effectively formed from aluminum or aluminum alloys which may also be readily used to form portions of the interferometric modulator, including, e.g., the mechanical and/or mirror layers. The n+-type semiconductor layers 112, 115 and the p+-type semiconductor layer 114 in certain embodiments comprise doped silicon, and silicon may be readily employed in the fabrication of the interferometric modulator array 100. For example, silicon may be advantageously employed as a sacrificial layer in intermediate steps in forming the gap 130.

An embodiment provides a method for making an interferometric modulator device that includes an integrated protection element. Various aspects of such a method are illustrated in the series of cross-sectional views shown in FIG. 17, which shows steps in a process for making the interferometric modulator array 100 shown in FIG. 10. Known deposition methods such as thermal chemical vapor deposition ("thermal CVD"), physical vapor deposition ("PVD") and PECVD may be used to deposit the various layers discussed below.

Figure 17A:
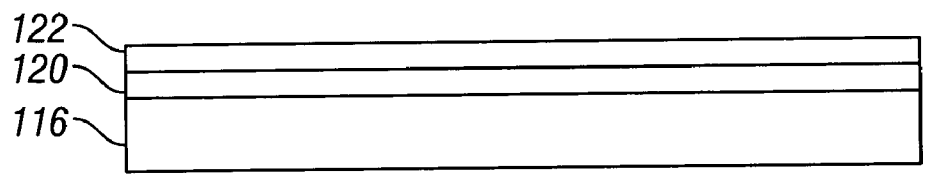
FIGS. 17A-17G illustrate aspects of an embodiment of a process for making the integrated interferometric modulator shown in FIG. 10.

FIG. 17A illustrates the deposition of the first optical layer 120 over the substrate 116. In this embodiment, the optical layer 120 comprises a layer of indium tin oxide (ITO) and a layer of chromium, and thus is an electrical conductor and may be referred to herein as the first electrode layer 120 because, in this embodiment, it functions as both an electrode and as an mirror in the resulting interferometric modulator. A dielectric layer 122 is formed over the optical layer 120. The dielectric layer 122 may comprise a silicon oxide (e.g., $SiO_2$). In the illustrated embodiment, the substrate 116 is glass, but other transparent materials such as plastic may also be used. In a step not shown, the dielectric layer 122 is masked and etched to form a window exposing the underlying first electrode layer 120.

Figure 17B:
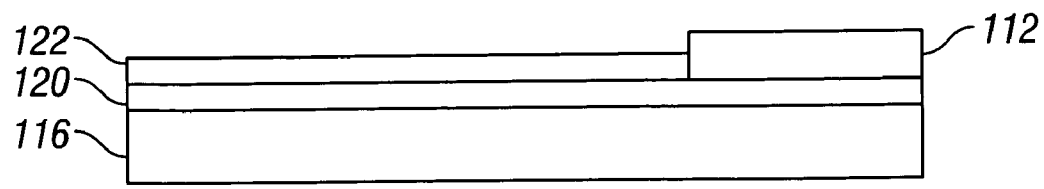
Figure 17C:
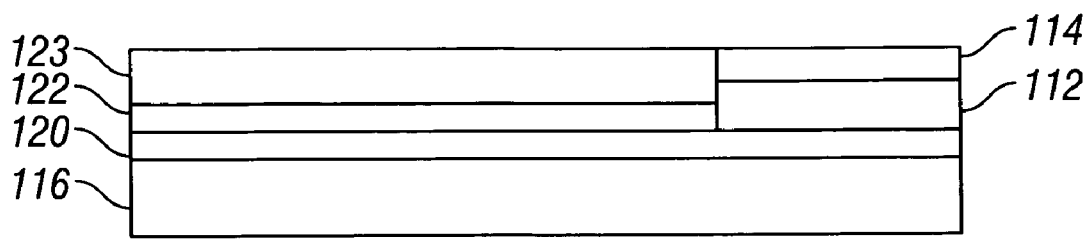
Figure 17D:
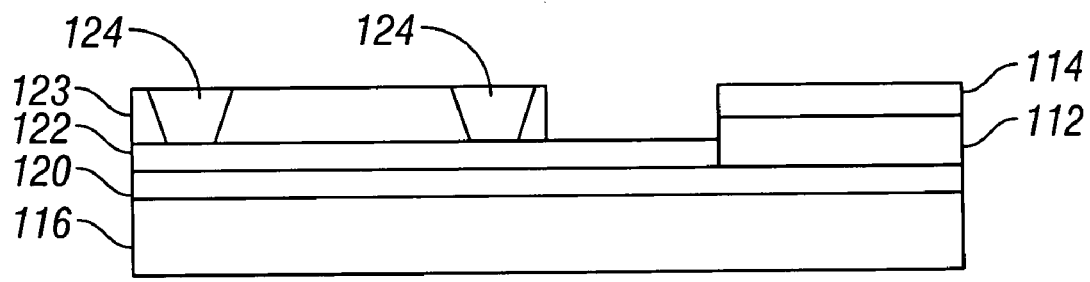

FIG. 17B shows the deposition of n+-type semiconductor layer 112 through the window and onto the first electrode layer 120. In situ doping may be used to dope the n+-type semiconductor layer to the extent desired. FIG. 17C shows the deposition of an amorphous silicon sacrificial layer 123 over the dielectric layer 122 and the deposition of a p+-doped amorphous silicon layer 114 over the n+-type semiconductor layer 112. Deposition of the amorphous silicon layers 123, 114 may be accomplished in separate steps by appropriate masking and etching. In an alternative embodiment, a single layer of amorphous silicon is be deposited over both the dielectric layer 122 and the n+-type semiconductor layer 112, and the amorphous silicon layer 114 is p+ doped by masking the single layer to expose the portion 114 and doping, such as by diffusion doping or ion bombardment to the extent desired. FIG. 17D illustrates masking and etching the sacrificial layer 123 to form apertures, then filling the apertures with a silicon oxide (e.g., $SiO_2$) or a polymer to form the posts 124.

Figure 17E:
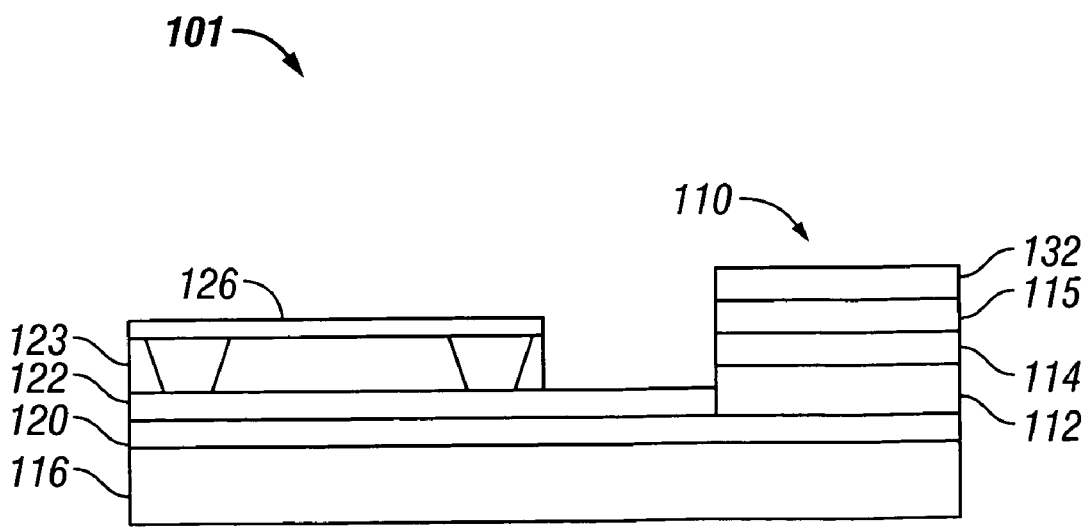

FIG. 17E illustrates an unreleased interferometric modulator 101 and a protection element 110 formed by masking the dielectric layer 122 and the sacrificial layer 123, depositing the n+-type semiconductor 115 onto the p+-type semiconductor layer 114 by in situ PECVD, then depositing an aluminum layer 126 over the sacrificial layer 123 and the posts 124, and concurrently depositing an aluminum layer 132 over the p+-type semiconductor layer 114. The electrode layer 126 is an electrical conductor and is optically reflective, and may be referred to herein as a mechanical/mirror layer.

Figure 17F:
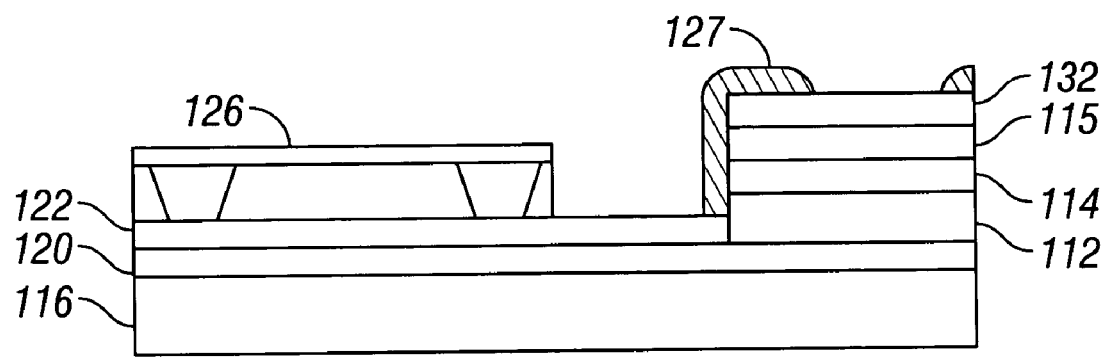
Figure 17G:
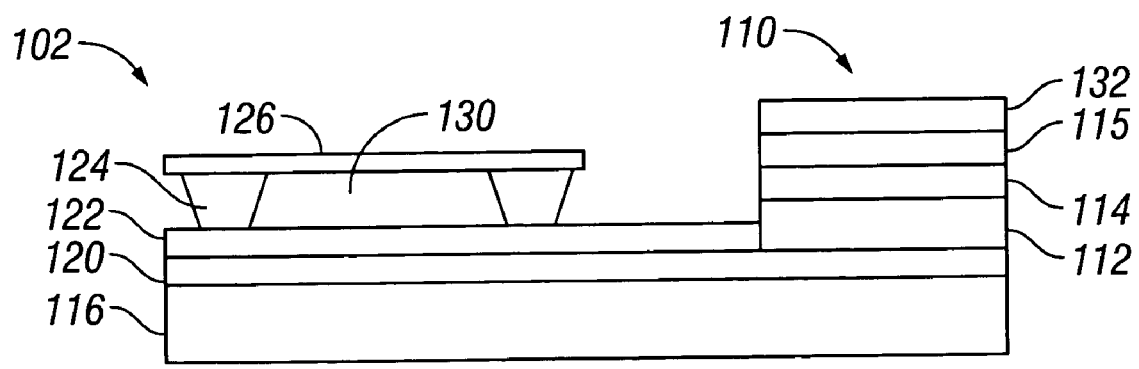

FIG. 17F shows the formation of a passivation layer 127 (such as a polymer or $SiO_2$) over the protection element 110. FIG. 17G shows the formation of the released interferometric modulator 102 by removing the sacrificial layer 123 by etching with a suitable etchant (e.g., $XeF_2$ and/or $F_2$ gas) to form the gap 130 in the interstitial space between electrode layer 126 and the dielectric layer 122. The passivation layer 127 is present during etching to prevent etching of the protection element 110 and is subsequently removed as shown in FIG. 17G. The aluminum layer 132 remaining over the over the p+-type semiconductor layer 114 is attached to a circuit ground (not shown) and thus is a ground plane. The n+-type semiconductor layer 112 deposited on the first electrode layer 120, the p+-type semiconductor layer 114 deposited on the +-type semiconductor layer 112, the n+-type semiconductor 115 deposited on the p+-type semiconductor layer 114, and the aluminum ground plane 132 are configured to shunt to ground an excess current carried by the first electrode layer 120 of the interferometric modulator 102.

Other integrated configurations of the ground plane and doped semiconductor layers may be deposited and used to shunt to ground an excess current carried by at least one of the first electrode layer and the second electrode layer. For example, the process illustrated in FIG. 17 involves the depositing the ground plane 132 over the doped semiconductor layers 112, 114, 115. A variation of the process illustrated in FIG. 17 that involves depositing the plurality of doped semiconductor layers over the ground plane may be used to make the interferometric modulator illustrated in FIG. 11. Although the protection element 110 is illustrated in FIG. 17 as being in proximity to the interferometric modulator 102, it is understood that the protection element 110 may be arranged near or at an outer edge or periphery of the interferometric modulator array 100 and over the substrate 116.

Other process flows may be used to make interferometric modulator devices that include integrated protection elements. For example, an array of interferometric modulator devices may be fabricated on a substrate, then masked. One or more protection elements may then be fabricated on the substrate, e.g., on an unmasked periphery of the substrate, then connected to the array of interferometric modulators. Such a process may also be carried out in reverse order, e.g., the one or more protective elements may be fabricated on the substrate, then masked, followed by fabrication of the interferometric modulators on the substrate and connection to the protection elements.

The integrated interferometric modulators and protection elements described herein may be incorporated into any device that is configured to display an image, as discussed above. Such incorporation generally involves electrical attachment of the integrated interferometric modulators and protection elements to various other components such as power sources, controller integrated circuits, memory, etc. Preferably such electrical connections to the integrated interferometric modulators are made via the integrated protection elements described herein. The integrated interferometric modulators and protection elements may also be electrically attached to various types of test equipment during manufacture. Such attachments are also preferably made via the integrated protection elements described herein.

These integrated protection elements are particularly advantageous for the protection of the integrated interferometric modulators during manufacture and testing. Although workers in such a manufacturing environment may be instructed to take suitable precautions to avoid exposing MEMS devices to ESD events, in actual practice some workers may fail to take such precautions in all cases. Integrated protection elements as described herein may be used to provide ESD protection that begins at or near the time that the MEMS device is fabricated, thereby decreasing the likelihood of damage during subsequent processing steps and increasing manufacturing yield.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A MEMS device comprising:
   a moveable element;
   an electrical conductor configured to carry an actuation current that is effective to actuate the moveable element; and a protection element operably attached to the electrical conductor and configured to at least partially shunt to ground an excess current carried by the electrical conductor, the protection element comprising a diode, the moveable element, electrical conductor and protection element being integrally formed over a substrate.

2. The MEMS device of claim 1 in which the diode is selected from the group consisting of back-to-back Zener diode, standard Zener diode, low capacitance Zener diode, symmetrical Zener diode, and low capacitance symmetrical diode.

3. The MEMS device of claim 1 in which the diode comprises a plurality of doped semiconductor layers.

4. The MEMS device of claim 1 in which the moveable element, electrical conductor and protection element are at a substantially same level over the substrate.

5. An interferometric modulator comprising:
an electrode integrated with a substrate and configured to carry an actuation current; and
a protection element connected to the electrode and configured to at least partially shunt to ground an excess current carried by the electrode, the protection element comprising a diode, the protection element being integrally formed with the substrate.

6. The interferometric modulator of claim 5 in which the diode is selected from the group consisting of back-to-back Zener diode, standard Zener diode, low capacitance Zener diode, symmetrical Zener diode, and low capacitance symmetrical diode.

7. The interferometric modulator of claim 5 in which the diode comprises a plurality of doped semiconductor layers.

8. The interferometric modulator of claim 5 in which the electrode and the protection element are at a substantially same level over the substrate.

9. The interferometric modulator of claim 5 further comprising a mirror operably attached to the electrode.

10. The interferometric modulator of claim 9 further comprising a second mirror spaced apart from and substantially parallel to the first mirror.

11. The interferometric modulator of claim 10 further comprising a second electrode operably attached to the second mirror.

12. The interferometric modulator of claim 11 further comprising a second protection element operably attached to the second electrode and configured to at least partially shunt to ground a second excess current carried by the second electrode.

13. The interferometric modulator of claim 12 in which the second protection element comprises a second diode.

14. The interferometric modulator of claim 13 in which the second diode is selected from the group consisting of back-to-back Zener diode, standard Zener diode, low capacitance Zener diode, symmetrical Zener diode, and low capacitance symmetrical diode.

15. A display device comprising;
a substrate;
a plurality of interferometric modulators formed over the substrate; and
a plurality of protection elements integrally formed with the plurality of interferometric modulators over the substrate, the plurality of protection elements comprising a plurality of doped semiconductor layers;
the plurality of protection elements being electrically connected to at least partially protect the plurality of interferometric modulators from an electrostatic discharge.

16. The display device of claim 15 in which the plurality of interferometric modulators are connected by row and column lines.

17. The display device of claim 16 in which the row and column lines are attached to the plurality of protection elements.

* * * * *

UNITED STATES PATENT AND TRADEMARK OFFICE
CERTIFICATE OF CORRECTION

| | | |
|---|---|---|
| PATENT NO. | : 7,405,861 B2 | Page 1 of 1 |
| APPLICATION NO. | : 11/119651 | |
| DATED | : July 29, 2008 | |
| INVENTOR(S) | : Philip D. Floyd | |

It is certified that error appears in the above-identified patent and that said Letters Patent is hereby corrected as shown below:

In the REFERENCES CITED, in the section entitled FOREIGN PATENT DOCUMENTS, please add the following publication:

WO     WO95/030924     11/1995

In the REFERENCES CITED, in the section entitled OTHER PUBLICATIONS, please add the following article:

ARATANI, ET AL., "Process and Design Considerations for Surface Micromachined Beams for a Tuneable Interferometer Array in Silicon," 0-7803-0957-2/93, IEEE, 1993, pp. 230-235.

On page 5, Col. 2, line 15, After "Lead" insert -- in --.

In Col. 6, line 20, Delete "3'33" and insert --3×3--, therefor.

Signed and Sealed this
Fifth Day of April, 2011

David J. Kappos
*Director of the United States Patent and Trademark Office*